(12) United States Patent
Makino et al.

(10) Patent No.: US 8,008,948 B2
(45) Date of Patent: Aug. 30, 2011

(54) PEAK VOLTAGE DETECTOR CIRCUIT AND BINARIZING CIRCUIT INCLUDING THE SAME CIRCUIT

(75) Inventors: Yasuaki Makino, Okazaki (JP); Hiroshi Okada, Nukata-gun (JP); Reiji Iwamoto, Nagoya (JP); Nobukazu Oba, Okazaki (JP); Shinji Nakatani, Okazaki (JP); Norikazu Ohta, Aichi-gun (JP); Hideki Hosokawa, Owariasahi (JP)

(73) Assignee: DENSO CORPORATION, Kariya (JP)

( * ) Notice: Subject to any disclaimer, the term of this patent is extended or adjusted under 35 U.S.C. 154(b) by 930 days.

(21) Appl. No.: 12/000,304

(22) Filed: Dec. 11, 2007

(65) Prior Publication Data

US 2008/0211544 A1 Sep. 4, 2008

Related U.S. Application Data

(63) Continuation-in-part of application No. 11/822,291, filed on Jul. 3, 2007, now abandoned.

(30) Foreign Application Priority Data

Jul. 6, 2006 (JP) .................................. 2006-186892
Jul. 6, 2007 (JP) .................................. 2007-178498

(51) Int. Cl.
*G01R 19/00* (2006.01)
*G06M 1/10* (2006.01)
(52) U.S. Cl. ..................... 327/59; 320/148; 324/76.16
(58) Field of Classification Search ...................... 327/59
See application file for complete search history.

(56) References Cited

U.S. PATENT DOCUMENTS

| 5,555,452 A | 9/1996 | Callaway, Jr. et al. |
| 5,598,086 A * | 1/1997 | Somerville .................... 320/148 |
| 5,729,130 A * | 3/1998 | Moody et al. ............ 324/207.12 |

FOREIGN PATENT DOCUMENTS

| JP | U-53-42652 | 4/1978 |
| JP | A-60-102568 | 6/1985 |
| JP | A-60-114771 | 6/1985 |
| JP | A-2-054177 | 2/1990 |
| JP | A-6-174756 | 6/1994 |
| JP | A-10-135800 | 5/1998 |
| JP | A-2006-252647 | 9/2006 |

OTHER PUBLICATIONS

Notice of Reasons for Refusal mailed on Oct. 19, 2010 issued from the Japanese Patent Office in the corresponding Japanese patent application No. 2007-178498 (with English translation).

* cited by examiner

*Primary Examiner* — Edward Tso
*Assistant Examiner* — Johali A Torres Ruiz
(74) *Attorney, Agent, or Firm* — Posz Law Group, PLC

(57) ABSTRACT

A peak voltage detector circuit detects a peak voltage of an input voltage. The input voltage is input into a first input terminal of a comparator. A counter circuit counts up a counter value in synchronization with a first clock signal, when a signal output from the comparator is in a first state. The counter circuit counts down the counter value in synchronization with a second clock signal. A digital-analog conversion circuit outputs an output voltage corresponding to the counter value, and the output voltage is input into a second input terminal of the comparator. The first clock signal has a wave period shorter than that of the second clock signal.

10 Claims, 11 Drawing Sheets

PEAK VOLTAGE DETECTOR CIRCUIT AND BINARIZING CIRCUIT INCLUDING THE SAME CIRCUIT

CROSS REFERENCE TO RELATED APPLICATIONS

This application is a continuation-in-part of application Ser. No. 11/822,291 filed on Jul. 3, 2007. Further, this application is based on Japanese Patent Applications No. 2006-186892 filed on Jul. 6, 2006 and No. 2007-178498 filed on Jul. 6, 2007, the disclosures of which are incorporated herein by reference in its entirety.

BACKGROUND OF THE INVENTION

1. Field of the Invention

The present invention relates to a peak voltage detector circuit for detecting a peak voltage of an input voltage, and a binarizing circuit using the peak voltage detector circuit.

2. Description of Related Art

When a physical phenomenon is observed by using a sensor, a peak of a measured voltage is often used to recognize a state of the physical phenomenon. At this time, the peak of the measured voltage is detected by using a peak voltage detector circuit. The peak voltage detector circuit is included in an apparatus, which measures a rotation number and a rotation angle of an axle using a magnet sensor, for example. In this apparatus, the magnet sensor measures voltage having alternating waveform in accordance with rotation of the axle. The measured voltage having the alternating waveform is binarized, and the binarized digital signal is converted into the rotation number and the rotation angle of the axle. In order to binarize the measured voltage having the alternating waveform, an intermediate value between a positive peak voltage and a negative peak voltage of the measured voltage is calculated. The positive peak voltage is convex upward so that the positive peak voltage provides a maximum peak voltage, and the negative peak voltage, i.e., bottom voltage, is convex downward so that the negative peak voltage provides a minimum peak voltage. Here, the positive peak voltage may be a plus voltage or a minus voltage, and the negative peak voltage may be a plus voltage or a minus voltage. The intermediate value is used as a threshold voltage to binarize the measured voltage. Therefore, in order to accurately convert the measured voltage having the alternating waveform into the digital signal, both of the positive peak voltage and the negative peak voltage are required to be accurately measured.

JP-A-6-174756 discloses a peak voltage detector circuit 100 shown in FIG. 14, which detects a peak voltage of an input voltage. Here, the input voltage may be changed between a plus voltage and a minus voltage. The peak voltage detector circuit 100 includes a comparator 120, an AND circuit 130, a counter circuit 140, a digital/analog (D/A) conversion circuit 150 and a first clock signal generating circuit for generating a clock signal CLK1. An input voltage $V_{IN}$ is input into a noninversion input terminal of the comparator 120, and an output voltage $V_{PEAK}$ output from the D/A conversion circuit 150 is input into an inversion input terminal of the comparator 120. When an output signal $V_{UP}$ output from the comparator 120 is high, the counter circuit 140 adds its counter value in synchronization with the clock signal CLK1 by using the AND circuit 130. The D/A conversion circuit 150 outputs a voltage corresponding to the counter value of the counter circuit 140. A peak voltage of the input voltage $V_{IN}$ is provided as the output voltage $V_{PEAK}$ of the D/A conversion circuit 150.

FIG. 15 shows a waveform chart of the peak voltage detector circuit 100. When the input voltage $V_{IN}$ becomes larger than the output voltage $V_{PEAK}$, the output signal $V_{UP}$ of the comparator 120 becomes high. When the output signal $V_{UP}$ of the comparator 120 is high, the AND circuit 130 inputs the clock signal CLK1 into the counter circuit 140. The counter circuit 140 adds the counter value in synchronization with the clock signal CLK1. Thereby, the output voltage $V_{PEAK}$ of the D/A conversion circuit 150 is stepwise increased in synchronization with the clock signal CLK1. That is, when the input voltage $V_{IN}$ is larger than the output voltage $V_{PEAK}$, the output voltage $V_{PEAK}$ is stepwise increased in synchronization with the clock signal CLK1 to follow the increasing of the input voltage $V_{IN}$.

When the input voltage $V_{IN}$ starts decreasing, the input voltage $V_{IN}$ becomes smaller than the output voltage $V_{PEAK}$. When the input voltage $V_{IN}$ is smaller than the output voltage $V_{PEAK}$, the output signal $V_{UP}$ of the comparator 120 becomes low. Thereby, the clock signal CLK1 is not input into the counter circuit 140, so that the counter circuit 140 stops adding the counter value. Thus, the peak voltage detector circuit 100 can detect the peak voltage of the input voltage $V_{IN}$.

FIG. 15 shows a single wave period of the input voltage $V_{IN}$, and FIG. 16 shows plural wave periods of the input voltage $V_{IN}$. The measured voltage output from the magnetic sensor, i.e., input voltage $V_{IN}$ of the peak voltage detector circuit 100, has a rapidly varying part and a slowly varying part, due to a temperature variation, for example. Therefore, as shown in FIG. 16, the peak voltage of the input voltage $V_{IN}$ is slowly increased in a time period T100, and the peak voltage of the input voltage $V_{IN}$ is slowly decreased in a time period T200, for example.

In a case where the positive peak voltage is to be detected by using the peak voltage detector circuit 100 disclosed in JP-A-6-174756, the peak voltage of the input voltage $V_{IN}$ can be detected in every wave period of the time period T100, as shown in FIG. 16. However, while the peak voltage of the input voltage $V_{IN}$ is gradually decreased in the time period T200, the maximum positive peak voltage hold in the time period T100 continues to be kept. Therefore, the peak voltage detector circuit 100 cannot detect the peak voltage of the input voltage $V_{IN}$ in the time period T200.

Further, in a case where the negative peak voltage, i.e., bottom voltage, is to be detected, the bottom voltage of the input voltage $V_{IN}$ can be detected in every wave period of the time period T200. However, the bottom voltage of the input voltage $V_{IN}$ cannot be detected in the time period T100.

SUMMARY OF THE INVENTION

In view of the foregoing and other problems, it is a first object of the present invention to provide a peak voltage detector circuit for detecting a peak voltage of an input voltage. It is a second object of the present invention to provide a binarizing circuit for binarizing an input voltage.

According to a first example of the present invention, a peak voltage detector circuit for detecting a peak voltage of an input voltage includes a comparator, a first clock signal generating circuit, a second clock signal generating circuit, a counter circuit and a digital-analog conversion circuit. The comparator has a first input terminal and a second input terminal, and the input voltage is input into the first input terminal of the comparator. The first clock signal generating circuit generates a first clock signal. The second clock signal generating circuit generates a second clock signal. The counter circuit counts up a counter value in synchronization with the first clock signal, when an output signal output from the comparator is in a first state. The counter circuit counts down the counter value in synchronization with the second clock signal. The digital-analog conversion circuit outputs an output voltage corresponding to the counter value of the counter circuit, and the output voltage of the digital-analog conversion circuit is input into the second input terminal of the comparator. The first clock signal has a wave period shorter than that of the second clock signal.

According to a second example of the present invention, a peak voltage detector circuit for detecting a positive peak voltage of an input voltage includes a comparator, a first clock signal generating circuit, a second clock signal generating circuit, a counter circuit and a digital-analog conversion circuit. The comparator has a noninversion input terminal and an inversion input terminal, and the input voltage is input into the noninversion input terminal of the comparator. The first clock signal generating circuit generates a first clock signal. The second clock signal generating circuit generates a second clock signal. The counter circuit adds a counter value in synchronization with the first clock signal, when an output signal output from the comparator is high. The counter circuit subtracts the counter value in synchronization with the second clock signal. The digital-analog conversion circuit outputs an output voltage corresponding to the counter value of the counter circuit, and the output voltage of the digital-analog conversion circuit is input into the inversion input terminal of the comparator. The first clock signal has a wave period shorter than that of the second clock signal.

According to a third example of the present invention, a peak voltage detector circuit for detecting a negative peak voltage of an input voltage includes a comparator, a first clock signal generating circuit, a second clock signal generating circuit, a counter circuit and a digital-analog conversion circuit. The comparator has a noninversion input terminal and an inversion input terminal, and the input voltage is input into the inversion input terminal of the comparator. The first clock signal generating circuit generates a first clock signal. The second clock signal generating circuit generates a second clock signal. The counter circuit subtracts a counter value in synchronization with the first clock signal, when an output signal output from the comparator is high. The counter circuit adds the counter value in synchronization with the second clock signal. The digital-analog conversion circuit outputs an output voltage-corresponding to the counter value of the counter circuit. The output voltage of the digital-analog conversion circuit is input into the noninversion input terminal of the comparator. The first clock signal has a wave period shorter than that of the second clock signal.

According to a fourth example of the present invention, a binarizing circuit for converting an input voltage having an alternating waveform into a digital signal includes the peak voltage detector circuit of the second example, the peak voltage detector circuit of the third example and a determination circuit. The determination circuit provides a threshold voltage based on a positive peak voltage provided by the peak voltage detector circuit of the second example, and a negative peak voltage provided by the peak voltage detector circuit of the third example. The determination circuit determines the input voltage to be high or low based on the provided threshold voltage.

Accordingly, the peak voltage can be accurately detected by the peak voltage detector circuit, and the input voltage can be accurately binarized by the binarizing circuit.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
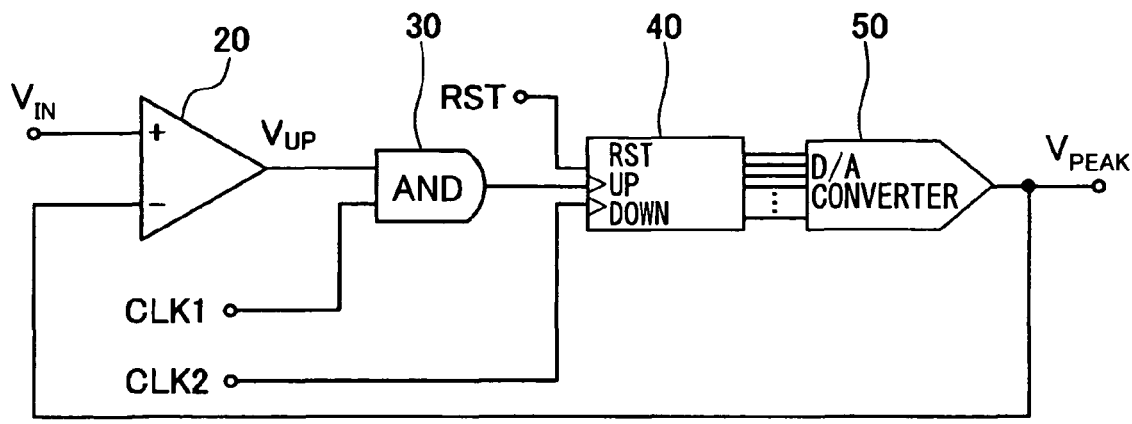
FIG. 1 is a schematic diagram showing a positive peak voltage detector circuit according to a first embodiment of the present invention.

As shown in FIG. 1, a positive peak voltage detector circuit 10 for detecting a peak voltage, i.e., voltage convex upward, includes a comparator 20, an AND circuit 30, a counter circuit 40, a digital/analog (D/A) conversion circuit 50, a first clock signal generating circuit and a second clock signal generating circuit. The first clock signal generating circuit generates a first clock signal CLK1, and a wave period of the first clock signal CLK1 is shorter than that of a second clock signal CLK2 generated by the second clock signal generating circuit. Each frequency of the first clock signal CLK1 and the second clock signal CLK2 is set in accordance with a physical phenomenon of an object to be measured.

An input voltage $V_{IN}$ is input into a noninversion input terminal of the comparator 20, and an output voltage $V_{PEAK}$ output from the D/A conversion circuit 50 is input into an inversion input terminal of the comparator 20. The input voltage $V_{IN}$ has an alternating waveform, and represents a measured voltage measured by a magnetic sensor disposed on an axle to measure its rotation number or rotation angle.

The AND circuit 30 has two input terminals. An output signal $V_{UP}$ output from the comparator 20 is input into one input terminal of the AND circuit 30, and the first clock signal CLK1 is input into the other input terminal of the AND circuit 30. The AND circuit 30 outputs an output signal in synchronization with the first clock signal CLK1 when the output signal $V_{UP}$ of the comparator 20 is high.

The counter circuit 40 is an up/down n-bit counter. An output signal output from the AND circuit 30 is input into an up-input terminal of the counter circuit 40. The second clock signal CLK2 is input into a down-input terminal of the counter circuit 40. The counter circuit 40 further has a reset-input terminal for resetting its counter value, into which a reset signal RST is input. The counter circuit 40 adds the counter value by using the AND circuit 30 in synchronization with the first clock signal CLK1 when the output signal $V_{UP}$ of the comparator 20 is high. Specifically, the counter 40 adds the counter value in synchronization with a timing when the first clock signal CLK1 turns to positive. The counter circuit 40 subtracts the counter value in synchronization with the second clock signal CLK2. Specifically, the counter circuit 40 subtracts the counter value in synchronization with a timing when the second clock signal CLK2 turns to be positive.

The D/A conversion circuit 50 outputs a voltage corresponding to the counter value of the counter circuit 40. The output voltage $V_{PEAK}$ of the D/A conversion circuit 50 is used as a positive peak voltage of the input voltage $V_{IN}$. Further, the output voltage $V_{PEAK}$ of the D/A conversion circuit 50 is input into the inversion input terminal of the comparator 20.

Figure 2:
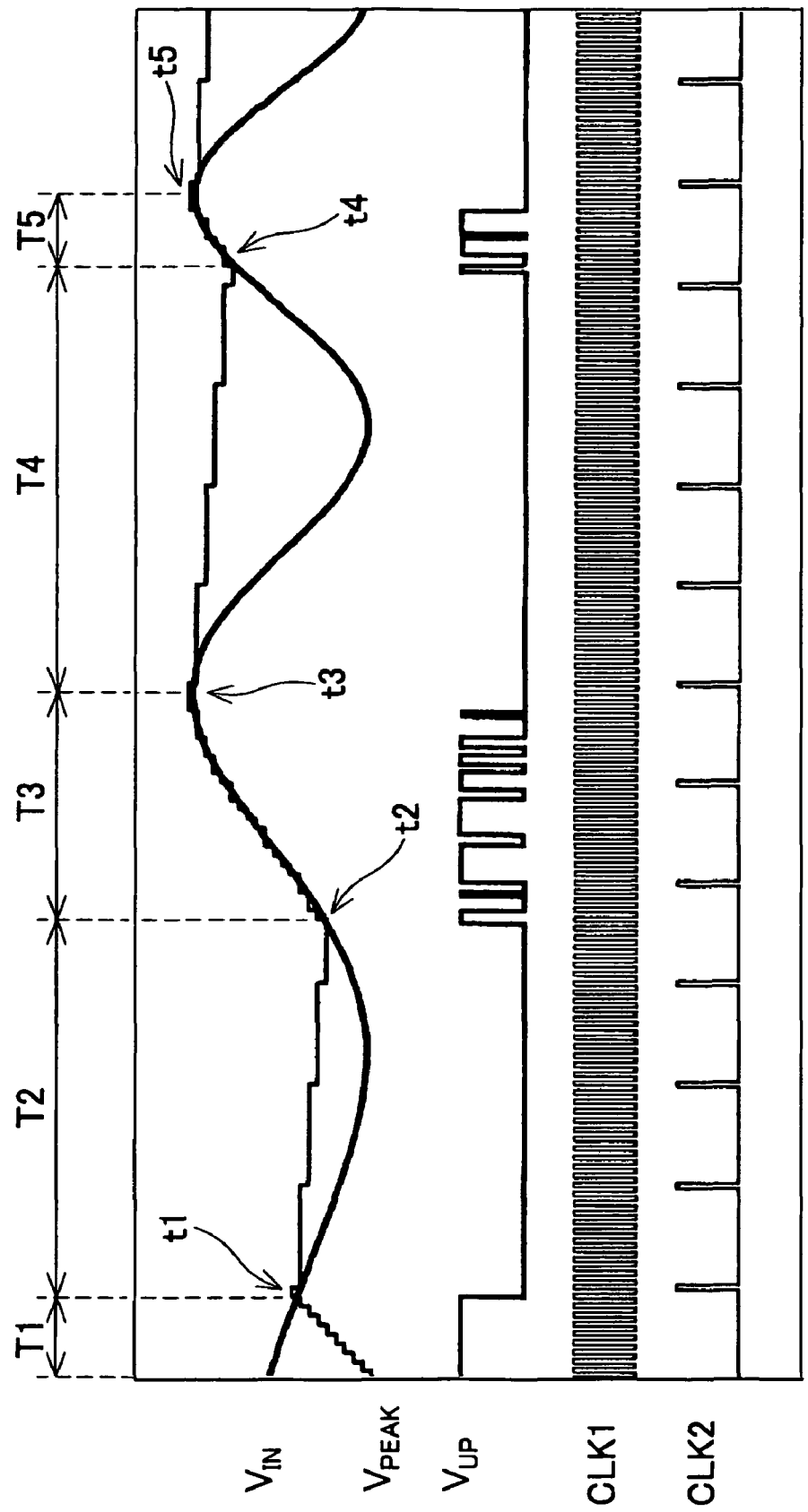
FIG. 2 is a waveform chart of the positive peak voltage detector circuit.

FIG. 2 shows a waveform chart of the peak voltage detector circuit 10. Each of a time period T1 and a time period T2 represents a transitional term. After the transitional term, the peak voltage detector circuit 10 operates to detect a positive peak voltage of the input voltage $V_{IN}$. Each of a time period T3 and a time period T5 represents a detection term, in which the positive peak voltage of the input voltage $V_{IN}$ is detected. A time period T4 represents a characteristic term, in which the detected positive peak voltage disappears and the next positive peak voltage appears.

The time period T1 and the time period T2 will be described in details. When measurement by the peak voltage detector circuit 10 is started, the reset signal RST is input into the counter circuit 40 to initialize the counter value of the counter circuit 40. At this time, the output voltage $V_{PEAK}$ of the D/A conversion circuit 50 is also initialized. Because an initial value of the counter value is set low, an initial value of the output voltage $V_{PEAK}$ is also low. The initial value of the counter value is set such that the output voltage $V_{PEAK}$ is lower than the input voltage $V_{IN}$. Therefore, at the measurement starting time, the output signal $V_{UP}$ of the comparator 20 becomes high, because the input voltage $V_{IN}$ is larger than the output voltage $V_{PEAK}$. The AND circuit 30 inputs the first clock signal CLK1 into the counter circuit 40 when the output signal $V_{UP}$ of the comparator 20 is high. The counter circuit 40 adds the counter value in synchronization with the first clock signal CLK1. Thereby, the output voltage $V_{PEAK}$ of the D/A conversion circuit 50 is stepwise increased in synchronization with the first clock signal CLK1, as shown of the time period T1 in FIG. 2.

At a timing t1, the output voltage $V_{PEAK}$ becomes equal to the input voltage $V_{IN}$. Then, when the input voltage $V_{IN}$ becomes smaller than the output voltage $V_{PEAK}$, the output signal $V_{UP}$ of the comparator 20 becomes low. The AND circuit 30 stops inputting the first clock signal CLK1 into the counter circuit 40, so that the counter circuit 40 stops adding the counter value. Thus, the increasing of the output voltage $V_{PEAK}$ is stopped. Here, the second clock signal CLK2 is input into the down-input terminal of the counter circuit 40. Therefore, the counter value of the counter circuit 40 is subtracted in synchronization with the second clock signal CLK2. Thus, the output voltage $V_{PEAK}$ is decreased in synchronization with the second clock signal CLK2 in the time period T2.

At a timing t2, when the input voltage $V_{IN}$ becomes larger than the output voltage $V_{PEAK}$, the time period T3 is started in order to detect the positive peak voltage of the input voltage $V_{IN}$. When the input voltage $V_{IN}$ is larger than the output voltage $V_{PEAK}$, the output signal $V_{UP}$ of the comparator 20 becomes high. When the output signal $V_{UP}$ of the comparator 20 is high, the AND circuit 30 inputs the first clock signal CLK1 into the counter circuit 40, so that the counter circuit 40 adds the counter value in synchronization with the first clock signal CLK1. Thereby, the output voltage $V_{PEAK}$ of the D/A conversion circuit 50 is stepwise increased in synchronization with the first clock signal CLK1. That is, when the input voltage $V_{IN}$ is larger than the output voltage $V_{PEAK}$, the output voltage $V_{PEAK}$ is stepwise increased in synchronization with the first clock signal CLK1 to follow the increasing of the input voltage $V_{IN}$. Here, in the time period T3, the counter value of the counter circuit 40 is subtracted in synchronization with the second clock signal CLK2. However, a wave period of the second clock signal CLK2 is much longer than that of the first clock signal CLK1. Therefore, the subtraction of the counter value due to the second clock signal CLK2 can be practically ignored in comparison with the addition of the counter value due to the first clock signal CLK1. Therefore, the output voltage $V_{PEAK}$ is stepwise increased in synchronization with the first clock signal CLK1 to follow the increasing of the input voltage $V_{IN}$.

At a timing t3, when the input voltage $V_{IN}$ starts decreasing, the input voltage $V_{IN}$ becomes smaller than the output voltage $V_{PEAK}$. Then, the output signal $V_{UP}$ of the comparator 20 becomes low, and the first clock signal CLK1 is not input into the counter circuit 40. Therefore, the counter circuit 40 stops adding the counter value. Thus, the peak voltage detector circuit 10 can detect the positive peak voltage of the input voltage $V_{IN}$.

In the time period T4, the counter value of the counter circuit 40 is subtracted in synchronization with the second clock signal CLK2. Therefore, the output voltage $V_{PEAK}$ is stepwise decreased until when the next wave period of the input voltage $V_{IN}$ appears. Because the output voltage $V_{PEAK}$ is gradually decreased, the next wave period of the input voltage $V_{IN}$ can secure to be detected. Even if the input voltage $V_{IN}$ is slowly decreased, the next wave period of the input voltage $V_{IN}$ can secure to be detected.

Then, at a timing t4, when the input voltage $V_{IN}$ becomes larger than the output voltage $V_{PEAK}$, the next detection time period T5 is started in order to detect the next positive peak voltage of the input voltage $V_{IN}$. Description of the time period T5 is approximately similar to that of the time period T3, and description of the timing t5 is approximately similar to that of the timing t3.

Figure 3:
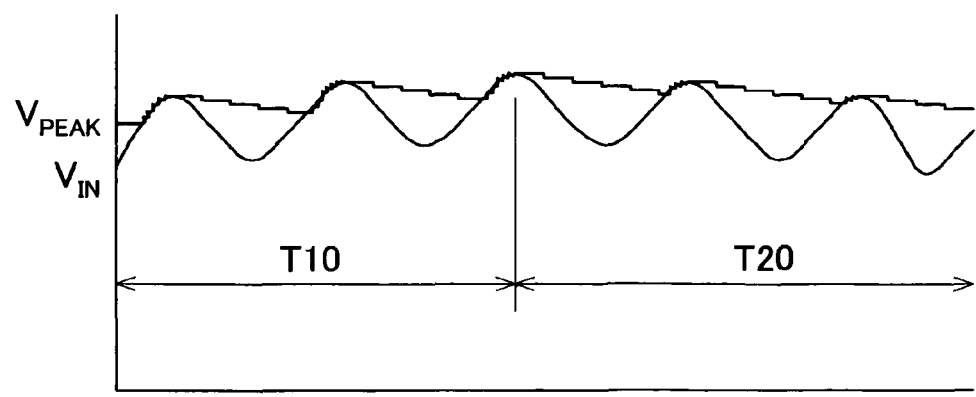
FIG. 3 is a waveform chart showing plural wave periods of an input voltage to be detected by the positive peak voltage detector circuit.

FIG. 3 shows plural wave periods of the input voltage $V_{IN}$. The measured voltage output from the magnetic sensor, i.e., input voltage $V_{IN}$ of the peak voltage detector circuit 10, has a rapidly varying part and a slowly varying part due to a temperature variation, for example. Therefore, as shown in FIG. 3, the peak voltage of the input voltage $V_{IN}$ is slowly increased in a time period T10, and the peak voltage of the input voltage $V_{IN}$ is slowly decreased in a time period T20. The peak voltage detector circuit 10 can detect the positive peak voltage of the input voltage $V_{IN}$ in every wave period of both of the time period T10 and the time period T20.

When the input voltage $V_{IN}$ is larger than the output voltage $V_{PEAK}$ of the D/A conversion circuit 50, the positive peak voltage detector circuit 10 adds the counter value of the counter circuit 40 by using the first clock signal CLK1, which has the wave period shorter than that of the second clock signal CLK2. Thus, the output voltage $V_{PEAK}$ of the D/A conversion circuit 50 can be increased to follow a rapid increasing of the input voltage $V_{IN}$. Further, the positive peak voltage detector circuit 10 subtracts the counter value of the counter circuit 40 by using the second clock signal CLK2, which has the wave period longer than that of the first clock signal CLK1. Therefore, the output voltage $V_{PEAK}$ of the D/A conversion circuit 50 can be decreased to follow a slow decreasing of the input voltage $V_{IN}$.

Due to the positive peak voltage detector circuit 10, the output voltage $V_{PEAK}$ can follow both of the rapid increasing and the slow decreasing of the input voltage $V_{IN}$ by using the first and second clock signals CLK1, CLK2. Due to the positive peak voltage detector circuit 10, the positive peak voltage of the input voltage $V_{IN}$ can be accurately detected.

Figure 4:
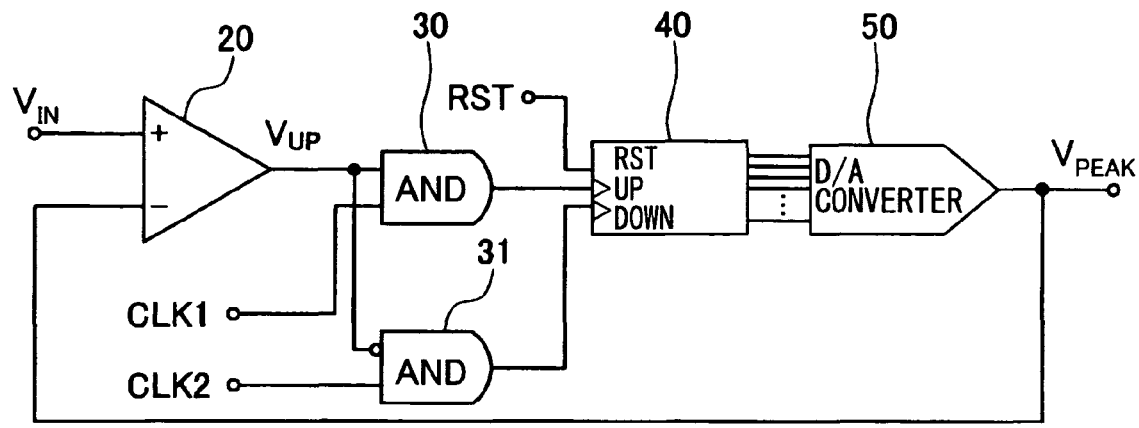
FIG. 4 is a schematic diagram showing a modification of the positive peak voltage detector circuit.

FIG. 4 shows a modification of the positive peak voltage detector circuit 10. In the modification, the circuit 10 further includes another AND circuit 31, i.e., second AND circuit 31. The second AND circuit 31 has two input terminals. An inversion signal inverted of the output signal $V_{UP}$ of the comparator 20 is input into one input terminal of the second AND circuit 31, and the second clock signal CLK2 is input into the other input terminal of the second AND circuit 31. The second AND circuit 31 outputs an output signal in synchronization with the second clock signal CLK2 when the output signal $V_{UP}$ of the comparator 20 is low.

According to the modification, the counter circuit 40 subtracts the counter value in synchronization with the second clock signal CLK2 when the output signal $V_{UP}$ of the comparator 20 is low. In other words, when the output signal $V_{UP}$ of the comparator 20 is high, that is when the input voltage $V_{IN}$ is larger than the output voltage $V_{PEAK}$, the counter value of the counter circuit 40 is not subtracted. Therefore, when the input voltage $V_{IN}$ is rapidly increased, the output voltage $V_{PEAK}$ can accurately follow the rapid increasing of the input voltage $V_{IN}$.

The voltage detected by the peak voltage detector circuit 10, 12 is slowly changed in synchronized with the second clock signal CLK2. Although this change is slow, the voltage is changed slightly. Thus, the peak voltage is not maintained to be constant in a precise sense. However, the change is very slow, and therefore, the peak voltage is substantially maintained to be constant. Further, in a case where the peak voltage detector circuit 10, 12 is used for a binary circuit, a direction that the positive peak voltage is slowly changed is opposite to a direction that the negative peak voltage is slowly changed, i.e., the slowly reduced direction of the positive peak voltage is opposite to the slowly increased direction of the negative peak voltage. Thus, a middle value between the positive peak voltage and the negative peak voltage is not changed even though the positive and negative peak voltages are changed. Thus, the middle value in each period can be obtained precisely even when the positive and negative peak voltages are changed.

Figure 5:
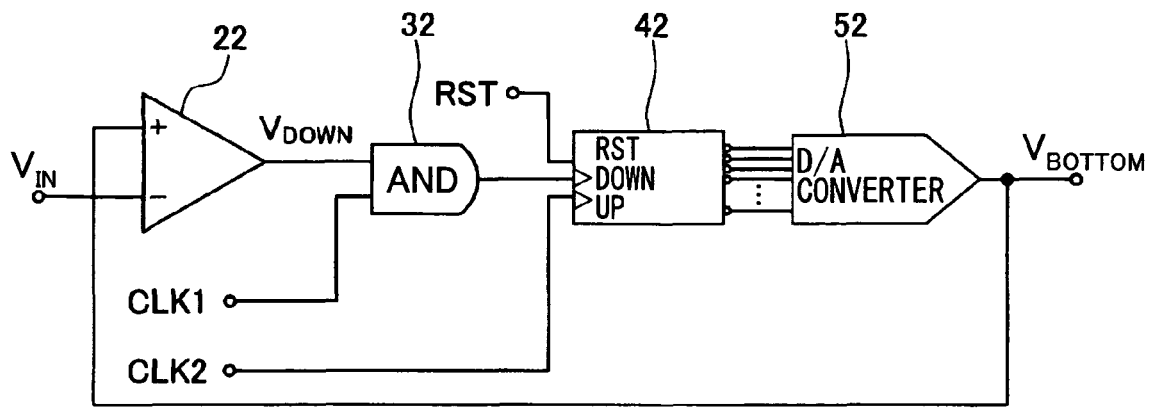
FIG. 5 is a schematic diagram showing a negative peak voltage detector circuit according to the first embodiment.

FIG. 5 shows a negative peak voltage detector circuit 12 for detecting a negative peak voltage, i.e., voltage convex downward. An input voltage $V_{IN}$ is input into an inversion input terminal of a comparator 22, and an output voltage $V_{BOTTOM}$ of a D/A conversion circuit 52 is input into a noninversion input terminal of the comparator 22. Further, an output of an up/down n-bit counter circuit 42 is inverted, and the inverted output is input into a D/A conversion circuit 52. The other parts in the negative peak voltage detector circuit 12 may be made similar to the positive peak voltage detector circuit 10.

When the input voltage $V_{IN}$ is smaller than the output voltage $V_{BOTTOM}$, an output signal $V_{DOWN}$ of the comparator 22 becomes high. When the output signal $V_{DOWN}$ of the comparator 22 is high, the AND circuit 32 inputs the first clock signal CLK1 into an up-input terminal of the counter circuit 42. Therefore, when the input voltage $V_{IN}$ is smaller than the output voltage $V_{BOTTOM}$, the counter value of the counter circuit 42 is added in synchronization with the first clock signal CLK1. However, because the output of the counter circuit 42 is inverted, the counter value of the counter circuit 42 is practically subtracted in synchronization with the first clock signal CLK1, when the input voltage $V_{IN}$ is smaller than the output voltage $V_{BOTTOM}$. Thus, when the input voltage $V_{IN}$ is smaller than the output voltage $V_{BOTTOM}$, the output voltage $V_{BOTTOM}$ can be decreased in synchronization with the first clock signal CLK1. Therefore, the output voltage $V_{BOTTOM}$ can be decreased to follow a rapid decreasing of the input voltage $V_{IN}$.

Further, by using the second clock signal CLK2 having a wave period longer than that of the first clock signal CLK1, the negative peak voltage detector circuit 12 subtracts the counter value of the counter circuit 42. Here, the output of the counter circuit 42 is inverted. Therefore, the counter value of the counter circuit 42 is practically added, so that the output voltage $V_{BOTTOM}$ of the D/A conversion circuit 52 can be increased. Thus, the output voltage $V_{BOTTOM}$ can be increased to follow a slow increasing of the input voltage $V_{IN}$.

According to the negative peak voltage detector circuit 12, the output voltage $V_{BOTTOM}$ can follow both of a rapid variation and a slow variation of the input voltage $V_{IN}$ by using the first and second clock signals CLK1, CLK2. Due to the negative peak voltage detector circuit 12, the negative peak voltage of the input voltage $V_{IN}$ can be accurately detected.

Figure 6:
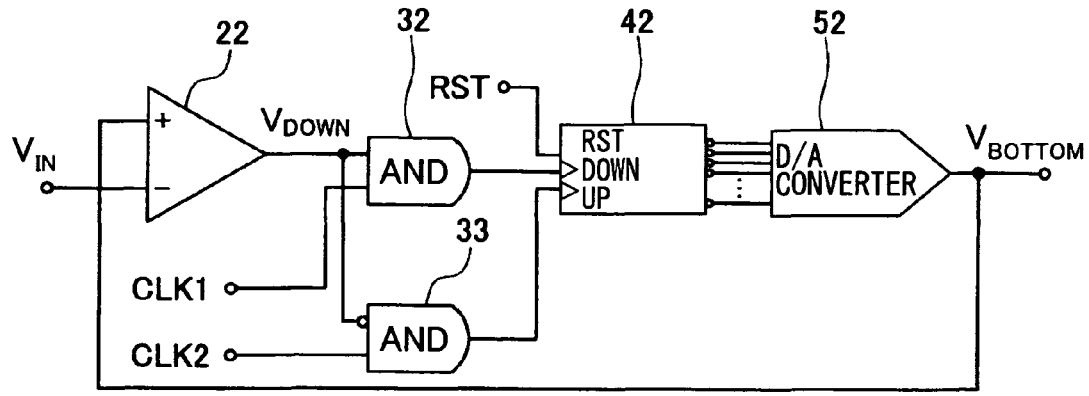
FIG. 6 is a schematic diagram showing a modification of the negative peak voltage detector circuit.

FIG. 6 shows a modification of the negative peak voltage detector circuit 12. In the modification, the circuit 12 further includes another AND circuit 33, i.e., second AND circuit 33. The second AND circuit 33 has two input terminals. An inversion signal inverted of the output signal $V_{DOWN}$ of the comparator 22 is input into one input terminal of the second AND circuit 33, and the second clock signal CLK2 is input into the other input terminal of the second AND circuit 33.

According to the modification, the counter circuit 42 practically adds the counter value in synchronization with the second clock signal CLK2 only when the output signal $V_{DOWN}$ of the comparator 22 is low. In other words, when the output signal $V_{DOWN}$ of the comparator 20 is high, that is when the input voltage $V_{IN}$ is smaller than the output voltage $V_{BOTTOM}$, the counter value of the counter circuit 42 is not added. Therefore, when the input voltage $V_{IN}$ is rapidly decreased, the output voltage $V_{BOTTOM}$ can accurately follow the rapid decreasing of the input voltage $V_{IN}$.

Second Embodiment

Figure 7:
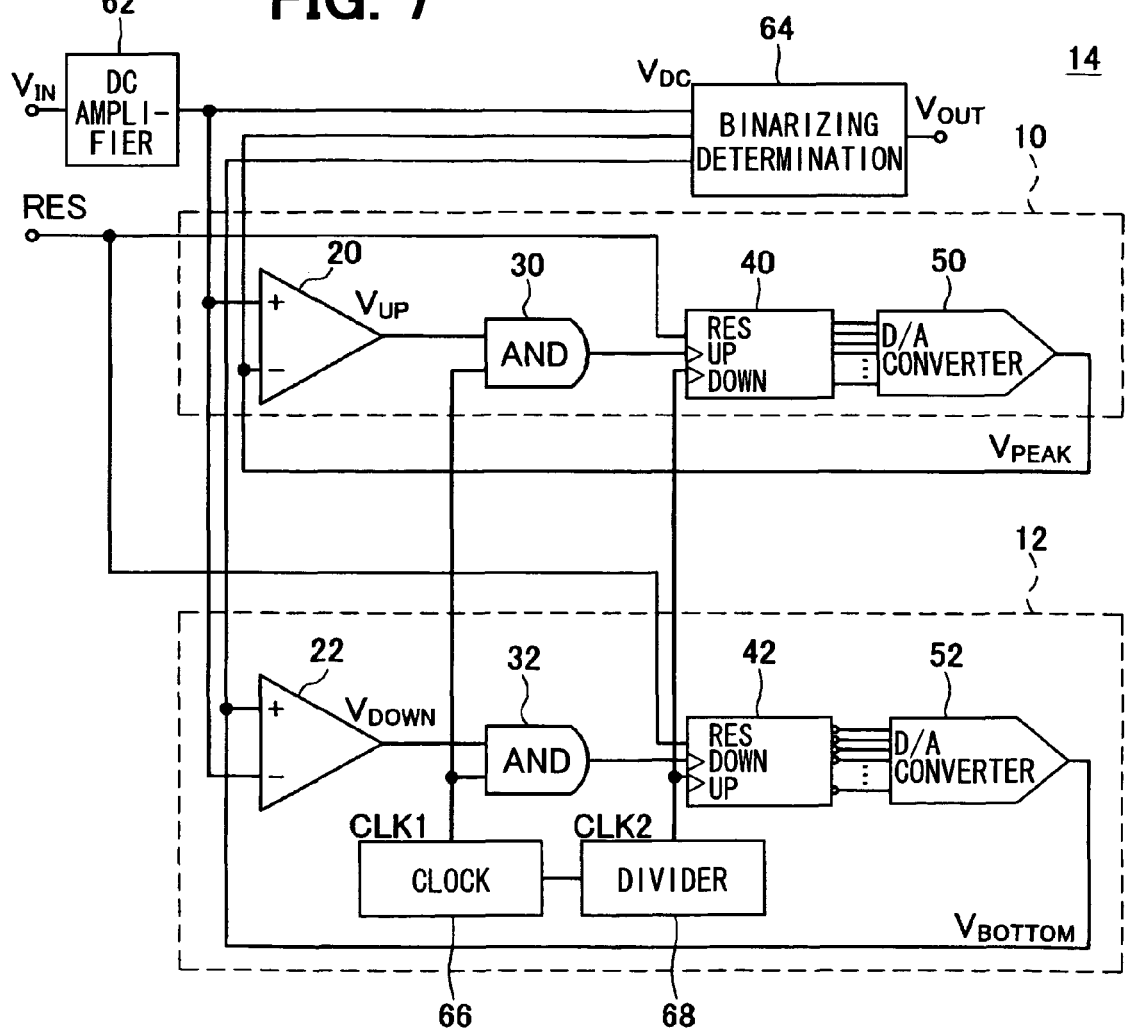
FIG. 7 is a schematic diagram showing a binarizing circuit according to a second embodiment.

FIG. 7 shows a binarizing circuit 14. The binarizing circuit 14 includes the positive peak voltage detector circuit 10 shown in FIG. 1, the negative peak voltage detector circuit 12 shown in FIG. 5, a binarizing determination circuit 64 and a direct-current (DC) amplifier circuit 62. The binarizing circuit 14 further includes a clock circuit 66 and a frequency divider circuit 68. The clock circuit 66 generates a first clock signal CLK1. The frequency divider circuit 68 converts the first clock signal CLK1 having high-frequency into a second clock signal CLK2 having a low-frequency. The DC amplifier circuit 62 amplifies an input voltage $V_{IN}$ into an input voltage $V_{DC}$.

The binarizing determination circuit 64 calculates an intermediate value as a threshold voltage by using the output voltage $V_{PEAK}$ detected by the positive peak voltage detector circuit 10 and the output voltage $V_{BOTTOM}$ detected by the negative peak voltage detector circuit 12. The binarizing determination circuit 64 determines the input voltage $V_{DC}$ to be high or low by using the threshold voltage. Thus, the binarizing determination circuit 64 can convert the input voltage $V_{DC}$ into a digital signal $V_{OUT}$.

Figure 8:
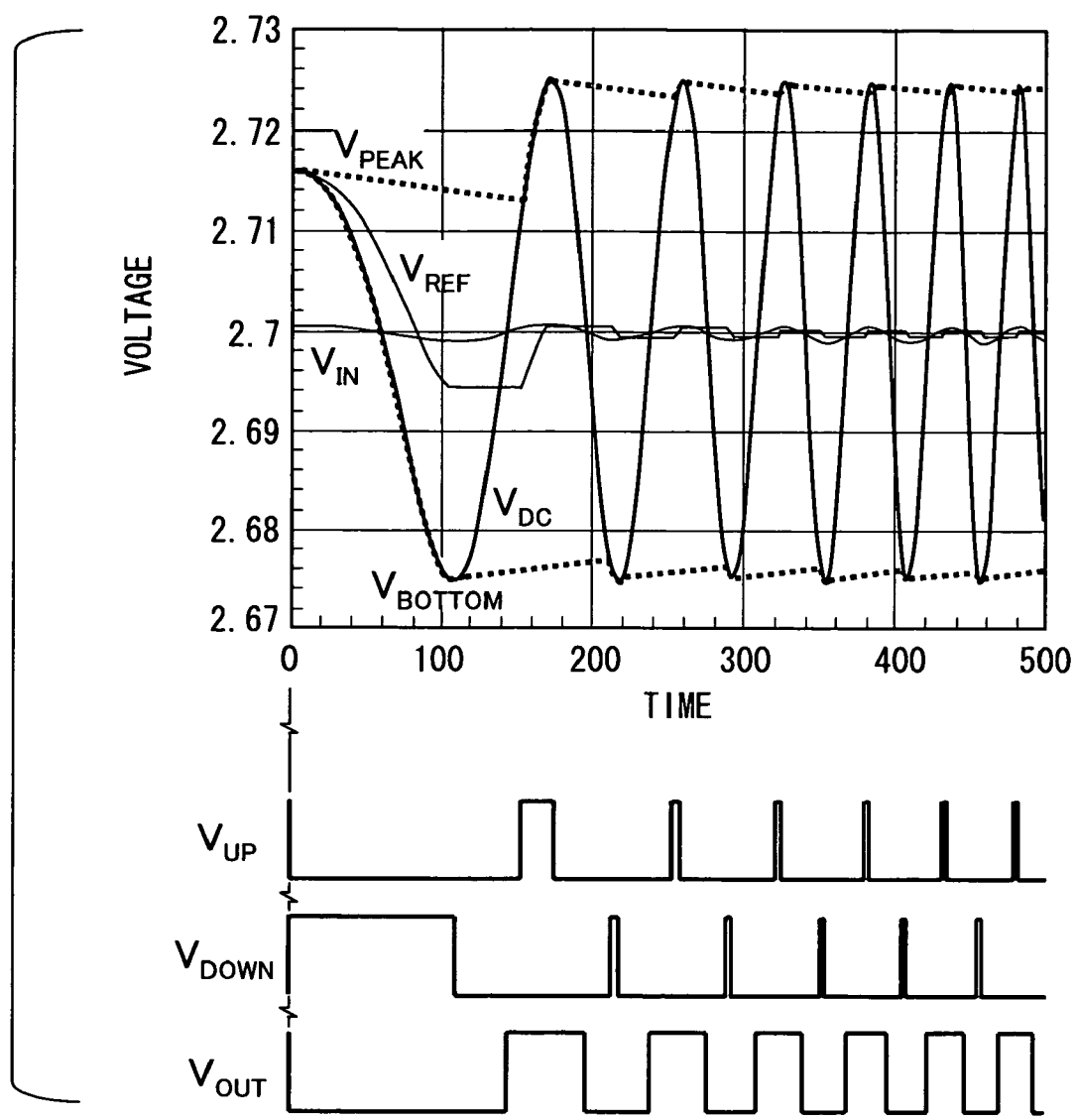
FIG. 8 is a waveform chart of the binarizing circuit.

FIG. 8 shows a waveform chart of the binarizing circuit 14. The DC amplifier circuit 62 amplifies the input voltage $V_{IN}$ into the amplified input voltage $V_{DC}$, which has an alternating waveform varying in a range between about 2.67V and about 2.73V, for example.

The positive peak voltage detector circuit 10 can accurately detect the output voltage $V_{PEAK}$ corresponding to the positive peak voltage, and the negative peak voltage detector circuit 12 can accurately detect the output voltage $V_{BOTTOM}$ corresponding to the negative peak voltage. Therefore, an accurate threshold voltage $V_{REF}$ can be provided by the determination circuit 64 using the accurate output voltages $V_{PEAK}$, $V_{BOTTOM}$. Thus, the amplified input voltage $V_{DC}$ can be determined to be high or low by using the accurate threshold voltage $V_{REF}$, so that the input voltage $V_{DC}$ can be converted into the digital signal $V_{OUT}$.

Due to the circuits 10, 12, the output voltages $V_{PEAK}$, $V_{BOTTOM}$ are the accurate peak voltages, when the input voltage $V_{IN}$ has a slow varying part. Because the binarizing circuit 14 is constructed by the circuits 10, 12, the slow varying part of the input voltage $V_{IN}$ can be also reflected in the threshold voltage $V_{REF}$ provided by the output voltages $V_{PEAK}$, $V_{BOTTOM}$. Thus, the slow varying part of the input voltage $V_{IN}$ can be also reflected in the digital signal $V_{OUT}$ output from the binarizing circuit 14. Thus, the binarizing circuit 14 can accurately binarize the input voltage $V_{IN}$ having a rapidly varying part and the slowly varying part.

Third Embodiment

Figure 9:
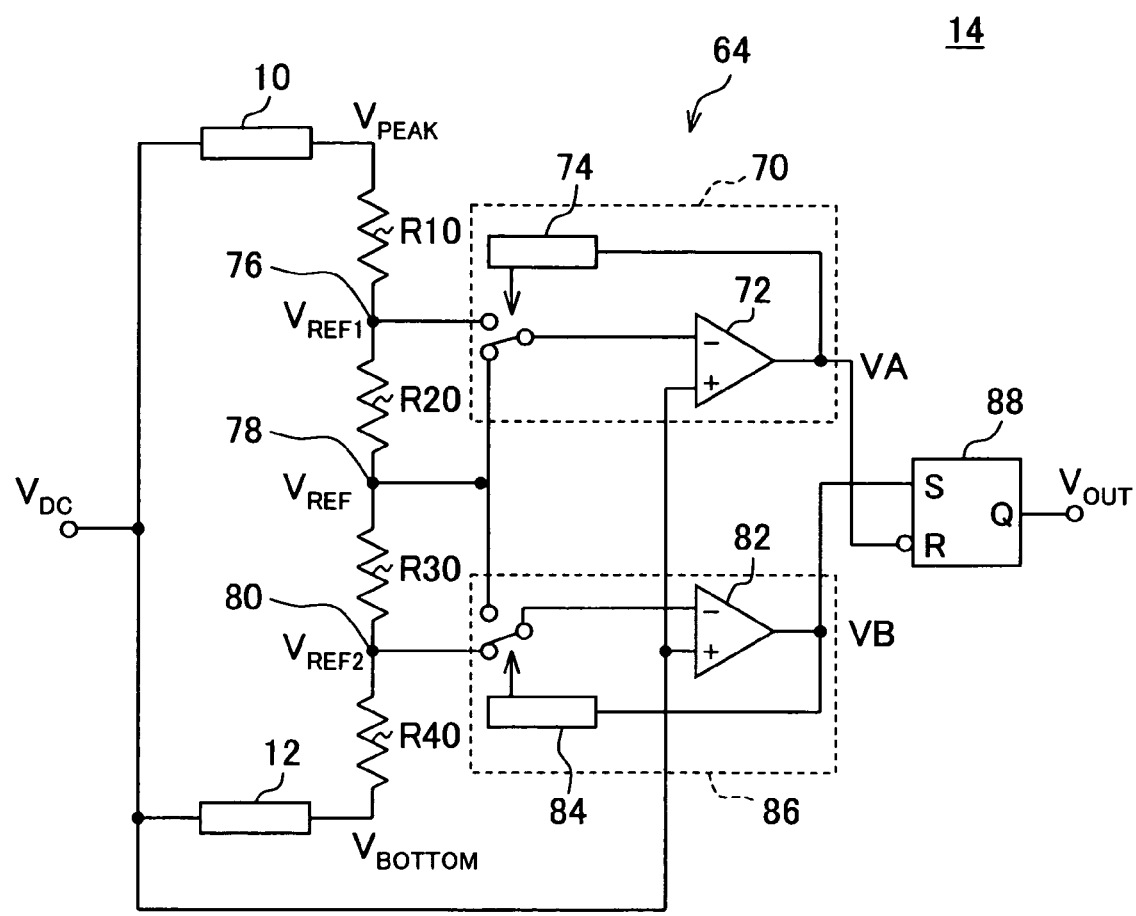
FIG. 9 is a schematic diagram showing a binarizing circuit according to a third embodiment.

FIG. 9 shows the binarizing circuit 14 according to a third embodiment. The circuit 14 includes a binarizing determination circuit 64 shown in FIG. 7. Here, the binarizing circuit 14 can reduce chattering of the output voltage $V_{OUT}$ even when a high frequency component is overlapped on the input voltage $V_{DC}$. The positive peak voltage detector circuit 10, i.e., a peak voltage detection circuit, and the negative peak voltage detector circuit 12, i.e., a bottom voltage detection circuit, are explained above.

The binarizing circuit 14 generates a high side off-set threshold voltage $V_{REF1}$ and a low side off-set threshold voltage $V_{REF2}$ by using the peak voltage $V_{PEAK}$ and the bottom voltage $V_{BOTTOM}$.

As shown in FIG. 9, the binarizing determination circuit 64 includes a first comparator circuit 70, a second comparator circuit 86 and, a flip-flop circuit 88 as a selecting circuit. The binarizing determination circuit 64 further includes four resistors R10-R40. The resistors R10-R40 will be explained as follows.

The input signal $V_{DC}$ amplified by the DC amplifier circuit 62 is input into the input terminal of the peak voltage detector circuit 10. The input voltage $V_{DC}$ is also input into the input terminal of the bottom voltage detector circuit 12. The resistors R10-R40 are connected in series between the output terminal of the peak voltage detector circuit 10 and the output terminal of the bottom voltage detector circuit 12. A first connection terminal 76 is formed between the first resistor R10 and the second resistor R20. A second connection terminal 78 is formed between the second resistor R20 and the third resistor R30. A third connection terminal 80 is formed between the third resistor R30 and the fourth resistor R40.

The resistance of each resistor R10-R40 is the same. Accordingly, a voltage of each connection terminal 76, 78, 80 is adjusted to the following value.

$$V_{REF}=(V_{PEAK}-V_{BOTTOM})\times(1/2)+V_{BOTTOM}$$

$$V_{REF1}=(V_{PEAK}-V_{BOTTOM})\times(3/4)+V_{BOTTOM}$$

$$V_{REF2}=(V_{PEAK}-V_{BOTTOM})\times(1/4)+V_{BOTTOM}$$

The voltage of the second connection terminal 78 is adjusted to be a center value between the peak voltage $V_{PEAK}$ and the bottom voltage $V_{BOTTOM}$. This voltage is used as a reference threshold voltage $V_{REF}$. The voltage of the first connection terminal 76 is adjusted to be a center value between reference threshold voltage $V_{REF}$ and the peak voltage $V_{PEAK}$. This voltage is used as a high side off-set threshold voltage $V_{REF1}$. The voltage of the third connection terminal 80 is adjusted to be a center value between reference threshold voltage $V_{REF}$ and the bottom voltage $V_{BOTTOM}$. This voltage is used as a low side off-set threshold voltage $V_{REF2}$.

The first comparator circuit 70 is explained as follows. The first comparator circuit 70 includes a first operational amplifier 72 and a first switching circuit 74. The first comparator circuit 70 inverts the output from positive to negative when the input voltage $V_{DC}$ is smaller than the reference threshold voltage $V_{REF}$, and further, switches the threshold value from the reference threshold voltage $V_{REF}$ to the high side off-set threshold voltage $V_{REF1}$. The first comparator circuit 70 inverts the output from negative to positive when the input voltage $V_{DC}$ is larger than the high side off-set threshold voltage $V_{REF1}$, and further, switches the threshold value from the high side off-set threshold voltage $V_{REF1}$ to the reference threshold voltage $V_{REF}$. The input voltage $V_{DC}$ is input into the non-inversion input terminal of the first operational amplifier 72. The first switching circuit 74 switches a terminal to be connected to the inversion input terminal of the first operational amplifier 72 between the first connection terminal 76 and the second connection terminal 78 according to the output of the first operational amplifier 72. Thus, the first switching circuit 74 switches the voltage to be input into the inversion input terminal of the first operational amplifier 72 between the high side off-set threshold voltage $V_{REF1}$ and the reference threshold voltage $V_{REF}$ according to the output of the first operational amplifier 72.

The second comparator circuit 86 is explained as follows. The second comparator circuit 86 includes a second operational amplifier 82 and a second switching circuit 84. The second comparator circuit 86 inverts the output from negative to positive when the input voltage $V_{DC}$ is larger than the reference threshold voltage $V_{REF}$, and further, switches the threshold value from the reference threshold voltage $V_{REF}$ to the low side off-set threshold voltage $V_{REF2}$. The second comparator circuit 86 inverts the output from positive to negative when the input voltage $V_{DC}$ is smaller than the low side off-set threshold voltage $V_{REF2}$, and further, switches the threshold value from the low side off-set threshold voltage $V_{REF2}$ to the reference threshold voltage $V_{REF}$. The input voltage $V_{DC}$ is input into the non-inversion input terminal of the second operational amplifier 82. The second switching circuit 84 switches a terminal to be connected to the inversion input terminal of the second operational amplifier 82 between the second connection terminal 78 and the third connection terminal 80 according to the output of the second operational amplifier 82. Thus, the second switching circuit 84 switches the voltage to be input into the inversion input terminal of the second operational amplifier 82 between the low side off-set threshold voltage $V_{REF2}$ and the reference threshold voltage $V_{REF}$ according to the output of the second operational amplifier 82.

The flip-flop circuit 88 is explained as follows. The output voltages of the first and second comparator circuits 70, 86 are input into the flip-flop circuit 88. The flip-flop circuit 88 selects one of an output inversion operation of the first comparator circuit 70 and an output inversion operation of the second comparator circuit 86, so that the output of one of the first and second comparator circuits 70, 86 is inverted. Here, the output inversion operation of the first comparator circuit 70 provides to invert the output from positive to negative when the input voltage $V_{DC}$ is smaller than the reference threshold voltage $V_{REF}$, and the output inversion operation of the second circuit 86 provides to invert the output from negative to positive when the input voltage $V_{DC}$ is larger than the reference threshold voltage $V_{REF}$. The output of the first operational amplifier 72 is inverted, and after that, the inverted output is input into a reset terminal R of the flip-flop circuit 88. The output of the second operational amplifier 82 is not inverted, and after that, the not-inverted output is input into a set terminal S of the flip-flop circuit 88.

Figure 10:
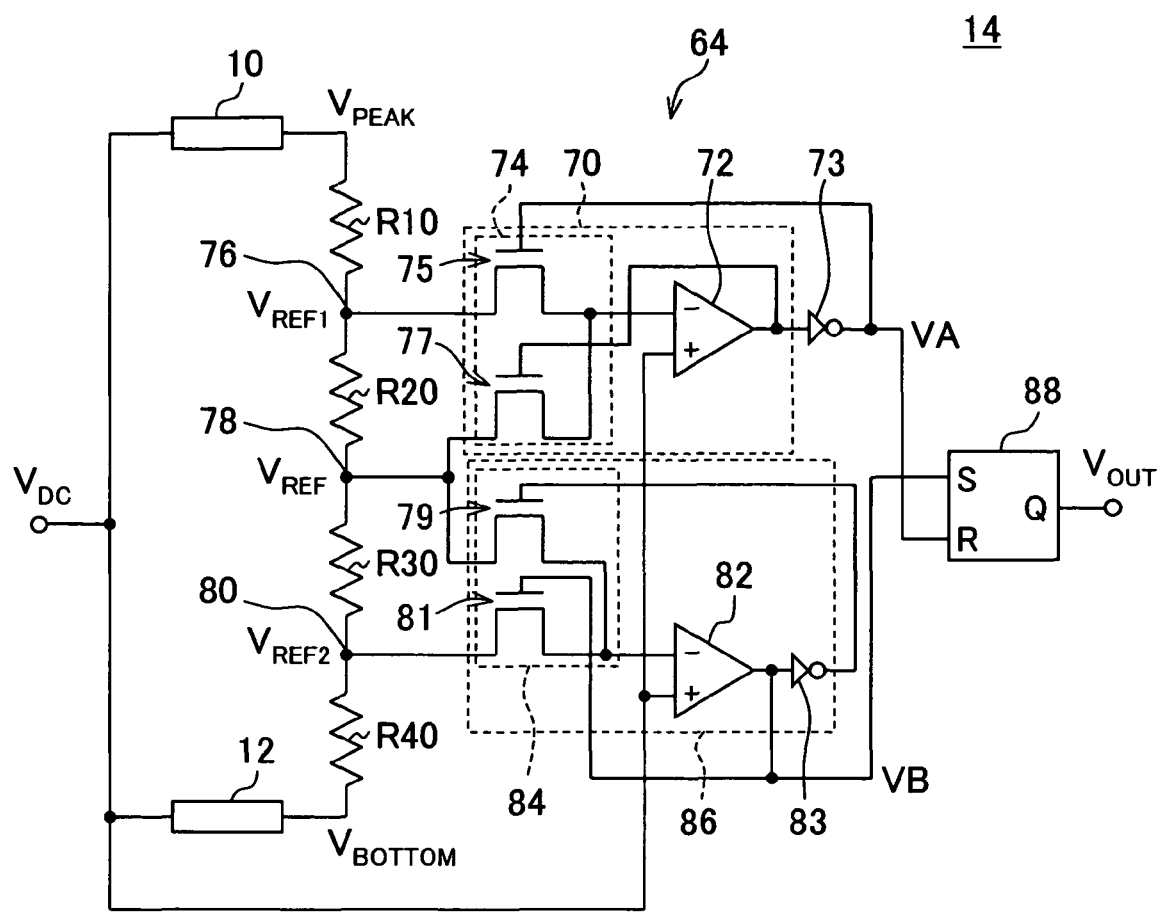
FIG. 10 is a detailed schematic diagram showing the binarizing circuit according to the third embodiment.

FIG. 10 shows the first and second switching circuits 74, 84.

The first switching circuit 74 includes a first transistor 75 and a second transistor 77. The first transistor 75 is formed between the inversion input terminal of the first operational amplifier 72 and the first connection terminal 76. The output of the first operational amplifier 72 that is inverted by an inverter 73 is input into the gate of the first transistor 75. The second transistor 77 is formed between the inversion input terminal of the first operational amplifier 72 and the second connection terminal 78. The output of the first operational amplifier 72 that is not inverted by the inverter 73 is input into the gate of the second transistor 77.

The second switching circuit 84 includes a third transistor 79 and a fourth transistor 81. The third transistor 79 is formed between the inversion input terminal of the second operational amplifier 82 and the second connection terminal 78. The output of the second operational amplifier 82 that is inverted by an inverter 83 is input into the gate of the third transistor 79. The fourth transistor 81 is formed between the inversion input terminal of the second operational amplifier 82 and the third connection terminal 80. The output of the fourth operational amplifier 82 that is not inverted by the inverter 83 is input into the gate of the fourth transistor 81.

The operation of the binarizing circuit 14 is explained as follows with reference to FIGS. 10 to 11D. Here, the peak voltage $V_{PEAK}$ and the bottom voltage $V_{BOTTOM}$ are constant.

First, the operation of the first comparator circuit 70 is explained.

Each of the first and second transistors 75, 77 turns on when a positive voltage is applied to the gate.

The high side off-set threshold voltage $V_{REF1}$ is input into the inversion input terminal of the first operational amplifier 72, and the input voltage $V_{DC}$ is input into the non-inversion input terminal of the first operational amplifier 72 just before the input voltage $V_{DC}$ exceeds the high side off-set threshold voltage $V_{REF1}$. When the input voltage $V_{DC}$ exceeds the high side off-set threshold voltage $V_{REF1}$ at the time t12, t16, the output of the first operational amplifier 72 switches from low (i.e., negative) to high (i.e., positive). The output voltage of the first operational amplifier 72 is inverted by the inverter 73, and the negative voltage is input into the gate of the first transistor 75. Then, the first transistor 75 turns off. Further, the output voltage of the first operational amplifier 72 is not inverted by the inverter 73, and the non-inverted output voltage is applied to the gate of the second transistor 77. As a result, the positive voltage is input into the gate of the second transistor 77. Then, the second transistor 77 turns on, and the reference threshold voltage $V_{REF}$ is input into the inversion input terminal of the first operational amplifier 72.

When the input voltage $V_{DC}$ falls below the reference threshold voltage $V_{REF}$ at the time t13, t17, the output of the first operational amplifier 72 switches from high to low. The output voltage of the first operational amplifier 72 is inverted by the inverter 73, and the positive voltage is input into the gate of the first transistor 75. Then, the first transistor 75 turns on. Further, the output voltage of the first operational amplifier 72 is not inverted by the inverter 73, and the non-inverted output voltage is applied to the gate of the second transistor 77. As a result, the negative voltage is input into the gate of the second transistor 77. Then, the second transistor 77 turns off, and the high side off-set threshold voltage $V_{REF1}$ is input into the inversion input terminal of the first operational amplifier 72.

Second, the operation of the second comparator circuit 86 is explained.

Each of the third and fourth transistors 79, 81 turns on when a positive voltage is applied to the gate.

The reference threshold voltage $V_{REF}$ is input into the inversion input terminal of the second operational amplifier 82, and the input voltage $V_{DC}$ is input into the non-inversion input terminal of the second operational amplifier 82 just before the input voltage $V_{DC}$ exceeds the reference threshold voltage $V_{REF}$. When the input voltage $V_{DC}$ exceeds the reference threshold voltage $V_{REF}$ at the time t11, t15, the output of the second operational amplifier 82 switches from low (i.e., negative) to high (i.e., positive). The output voltage of the second operational amplifier 82 is inverted by the inverter 83, and the negative voltage is input into the gate of the third transistor 79. Then, the third transistor 79 turns off. Further, the output voltage of the second operational amplifier 82 is not inverted by the inverter 83, and the non-inverted output voltage is applied to the gate of the fourth transistor 81. As a result, the positive voltage is input into the gate of the fourth transistor 81. Then, the fourth transistor 81 turns on, and the low side off-set threshold voltage $V_{REF2}$ is input into the inversion input terminal of the second operational amplifier 82.

When the input voltage $V_{DC}$ falls below the low side off-set threshold voltage $V_{REF2}$ at the time t14, t18, the output of the second operational amplifier 82 switches from high to low. The output voltage of the second operational amplifier 82 is inverted by the inverter 83, and the positive voltage is input into the gate of the third transistor 79. Then, the third transistor 79 turns on. Further, the output voltage of the second operational amplifier 82 is not inverted by the inverter 83, and the non-inverted output voltage is applied to the gate of the fourth transistor 81. As a result, the negative voltage is input into the gate of the fourth transistor 81. Then, the fourth transistor 81 turns off, and the reference threshold voltage $V_{REF}$ is input into the inversion input terminal of the second operational amplifier 82.

Figure 11A:
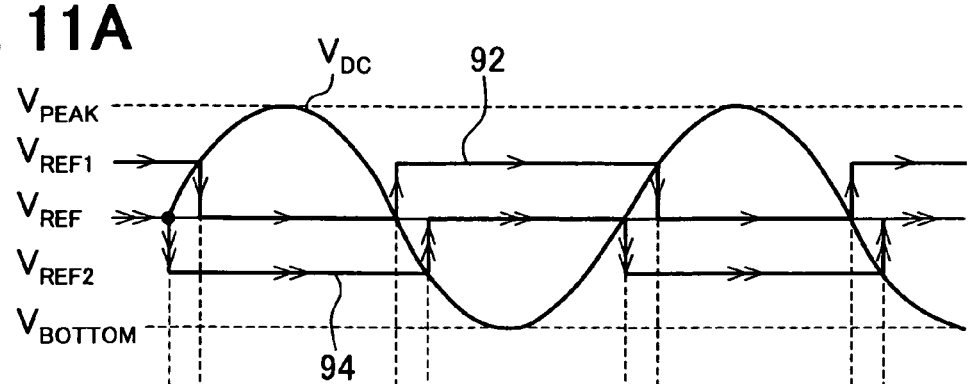
FIGS. 11A to 11D are graphs showing waveforms in the binarizing circuit according to the third embodiment.

By using the first comparator circuit 70, the threshold value switches to the reference threshold voltage $V_{REF}$ when the input voltage $V_{DC}$ exceeds the high side off-set threshold voltage $V_{REF1}$ at the time t12, t16. Further, the threshold value switches to the high side off-set threshold voltage $V_{REF1}$ when the input voltage $V_{DC}$ falls below the reference threshold voltage $V_{REF}$ at the time t13, t17. As shown in FIG. 11A, the threshold value as a reference of the first comparator circuit 70 changes in a stepwise manner, which is similar to the voltage level 92.

Figure 11B:
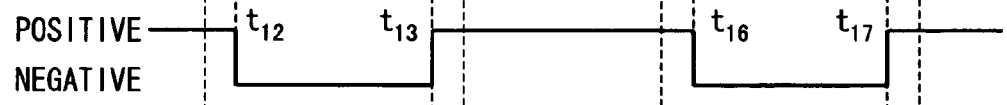

FIG. 11B shows the output VA after the output of the first comparator circuit 70 is inverted by the inverter 73. Specifically the output VA is to be input into the reset terminal R of the flip-flop circuit 88. The input voltage $V_{DC}$ exceeds the high side off-set threshold voltage $V_{REF1}$ at the time t12, t16, the output VA switches from positive to negative. Further, the input voltage $V_{DC}$ falls below the reference threshold voltage $V_{REF}$ at the time t13, t17, the output VA switches from negative to positive.

By using the second comparator circuit 86, the threshold value switches to the low side off-set threshold voltage $V_{REF2}$ when the input voltage $V_{DC}$ exceeds the reference threshold voltage $V_{REF}$ at the time t11, t15. Further, the threshold value switches to the reference threshold voltage $V_{REF}$ when the input voltage $V_{DC}$ falls below the low side off-set threshold voltage $V_{REF2}$ at the time t14, t18. As shown in FIG. 11A, the threshold value as a reference of the second comparator circuit 86 changes in a stepwise manner, which is similar to the voltage level 94.

Figure 11C:
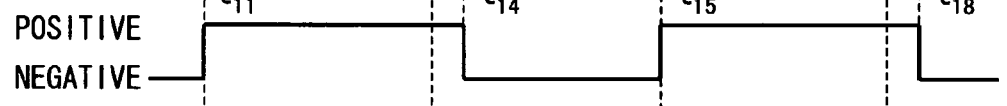

FIG. 11C shows the output VB of the second comparator circuit 86. Specifically the output VB is to be input into the set terminal S of the flip-flop circuit 88. The input voltage $V_{DC}$ exceeds the reference threshold voltage $V_{REF}$ at the time t11, t15, the output VB switches from negative to positive. Further, the input voltage $V_{DC}$ falls below the low side off-set threshold voltage $V_{REF2}$ at the time t14, t18, the output VB switches from positive to negative.

The inverted output voltage of the first comparator circuit 70 is input into the reset terminal R of the flip-flop circuit 88. Specifically, the voltage shown in FIG. 11B is input into the reset terminal R of the flip-flop circuit 88. The voltage of the output terminal $V_{OUT}$ in the flip-flop circuit 88 is inverted from positive to negative at the time t13, t17 when the output voltage shown in FIG. 11B is inverted from negative to positive. Further, the not-inverted output of the second comparator circuit 20 is input into the set terminal S. The voltage of the output terminal $V_{OUT}$ in the flip-flop circuit 88 is inverted from negative to positive at the time t11, t15 when the output shown in FIG. 11C is inverted from negative to positive. As a result, a binary signal $V_{OUT}$ shown in FIG. 11D is obtained. The binary signal $V_{OUT}$ switches from negative to positive at the time t11, t15 when the input voltage $V_{DC}$ exceeds the reference threshold voltage $V_{REF}$, and the binary signal $V_{OUT}$ switches from positive to negative at the time t13 t17 when the input voltage $V_{DC}$ falls below the reference threshold voltage $V_{REF}$.

The binarizing circuit 14 generates the high side off-set threshold voltage $V_{REF1}$ and the low side off-set threshold voltage $V_{REF2}$ by using the peak voltage $V_{PEAK}$ and the bottom voltage $V_{BOTTOM}$. Accordingly, the high side off-set threshold voltage $V_{REF1}$ and the low side off-set threshold voltage $V_{REF2}$ can be changed according to the amplitude of the analog signal $V_{DC}$, which is pulsated.

For example, in a case where a measurement object is an analog signal obtained from a magneto-resistance element for detecting magnetic flux, the analog signal as an input voltage has an amplitude, which is much reduced with respect to temperature change. For example, the amplitude of the analog signal from the magneto resistance element is reduced to be one-fourth when environmental temperature is changed from −40° C. to +180° C. When the high side off-set threshold voltage $V_{REF1}$ and the low side off-set threshold voltage $V_{REF2}$ are fixed, the analog signal may not exceeds the high side off-set threshold voltage $V_{REF1}$ and fall below the low side off-set threshold voltage $V_{REF2}$. In this case, the analog signal cannot be binarized precisely.

However, by using the binarizing circuit 14, the high side off-set threshold voltage $V_{REF1}$ and the low side off-set threshold voltage $V_{REF2}$ are adjusted in accordance with the amplitude of the analog signal even when the amplitude of the analog signal becomes small. Thus, the analog signal can be binarized precisely.

Fourth Embodiment

Figure 12:
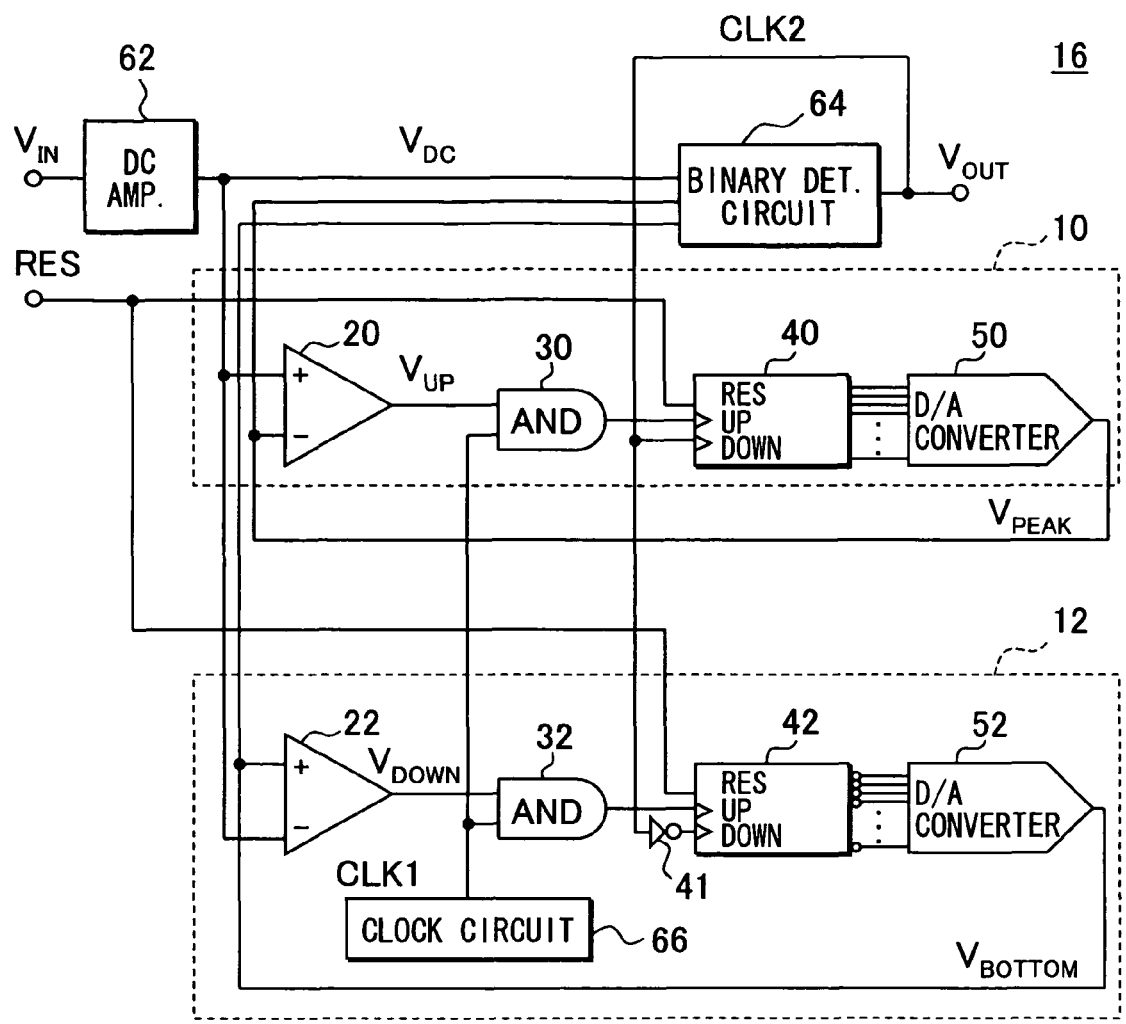
FIG. 12 is a schematic diagram showing a binarizing circuit according to a fourth embodiment.

FIG. 12 shows a binarizing circuit 16. The binarizing circuit 16 includes the binarizing determination circuit 64.

In the binarizing circuit 16, the output voltage $V_{OUT}$ of the binarizing circuit 16 is input into the down input terminal of the counter circuit 40. The output voltage $V_{OUT}$ of the binarizing circuit 16 is also input into the down input terminal of the counter circuit 42 through the inverter 41. The binarizing circuit 16 subtracts the counter value of the counter circuit 40 at the time t11, t15 in FIG. 1A when the output voltage $V_{OUT}$ of the binarizing circuit 16 switches from low to high. As a result, the output voltage $V_{PEAK}$ of the D/A converter circuit 50 is reduced. At the time t13, t17 shown in FIG. 11 when the output voltage $V_{OUT}$ of the binarizing circuit 16 switches from high to low, the counter value of the counter circuit 42 is subtracted. The output of the counter 42 is inverted, and then, inputted into the D/A converter circuit 52. Thus, the output voltage $V_{OUT}$ of the binarizing circuit 16 switches from high to low, the output voltage $V_{BOTTOM}$ increases. Thus, in the binarizing circuit 16, a timing when the output of the flip-flop circuit 88 is inverted is used as the second clock signal CLK2.

Here, functions of the binarizing circuit 16 are explained as follows. In the binarizing circuit 14 shown in FIG. 10, by using the second clock signal CLK2 of the frequency divider circuit 68, the output voltage $V_{PEAK}$ of the D/A converter circuit 50 is reduced. Further, by using the second clock signal CLK2 of the frequency divider circuit 68, the output voltage $V_{BOTTOM}$ of the D/A converter circuit 52 increases. Thus, when the second clock signal CLK2 is output, the output voltage $V_{PEAK}$ continues to be reduced, and the output voltage $V_{BOTTOM}$ continues to increase. As a result, the width between the high side off-set threshold voltage $V_{REF1}$ and the low side off-set threshold voltage $V_{REF2}$ becomes smaller.

However, in the binarizing circuit 16 shown in FIG. 12, an alternating waveform is binarized. The alternating waveform is generated by a magnetic sensor in accordance with rotation of a detection object. Based on a binarized signal, the number of rotations and a rotation angle are detected. Specifically, the number of rotations of a rotor having a gear shape is detected. The rotor rotates together with an axle shaft. When the rotor rotates, an input voltage having the alternating waveform with a large amplitude is generated. In the binarizing circuit 14, even when the amplitude of the input voltage is much reduced, for example by one-fourth in accordance with temperature change, the input voltage is precisely binarized. Thus, reduction of the amplitude of the input voltage by one-fourth may be occurred even when the rotor precisely rotates. Further, when the rotor stops rotating, the input voltage may be changed. For example, after the axle shaft stops rotating, the rotor may vibrate. In this case, the input voltage having a small amplitude is generated. This input voltage provides a noise voltage. The amplitude of the noise voltage is smaller than one-sixth of the amplitude of the normal input voltage.

As described before, the reference threshold voltage $V_{REF}$ is adjusted to be a center value between the peak voltage $V_{PEAK}$ and the bottom voltage $V_{BOTTOM}$. The high side off-set threshold voltage $V_{REF1}$ is adjusted to be a center value between the reference threshold voltage $V_{REF}$ and the peak voltage $V_{PEAK}$. The low side off-set threshold voltage $V_{REF2}$ is adjusted to be a center value between the reference threshold voltage $V_{REF}$ and the bottom voltage $V_{BOTTOM}$. When the input voltage $V_{DC}$ exceeds the high side off-set threshold voltage $V_{REF1}$, and when the input voltage $V_{DC}$ falls below the low side off-set threshold voltage $V_{REF2}$, the output voltage $V_{OUT}$ of the binarizing circuit 14 is inverted repeatedly. In the binarizing circuit 14, a width between the high side off-set threshold voltage $V_{REF1}$ and the low side off-set threshold voltage $V_{REF2}$ becomes smaller with time. Even if the amplitude of the noise voltage is small, the noise voltage may exceed the high side off-set threshold voltage $V_{REF1}$, or the noise voltage may fall below the low side off-set threshold voltage $V_{REF2}$. Thus, in the binarizing circuit 14, the output voltage $V_{OUT}$ may repeat inversion of the output voltage $V_{OUT}$.

However, in the binarizing circuit 16, the input voltage exceeds the reference threshold voltage $V_{REF}$, the threshold value of the second comparator circuit 86 is switched to the low side off-set threshold voltage $V_{REF2}$. Then, unless the input voltage falls below the low side off-set threshold voltage $V_{REF2}$, the threshold value of the second comparator circuit 86 is not switched to the reference threshold voltage $V_{REF}$. Further, when the input voltage falls below the reference threshold voltage $V_{REF}$, the threshold value of the first comparator circuit is switched to the high side off-set threshold voltage $V_{REF1}$. Then, unless the input voltage exceeds the high side off-set threshold voltage $V_{REF1}$, the threshold value of the first comparator circuit 70 is not switched to the reference threshold voltage $V_{REF}$. Since the amplitude of the noise voltage is smaller than one-sixth of the amplitude of the input voltage cause by the rotation of the gear, the noise voltage does not become larger than the amplitude of the high side off-set threshold voltage $V_{REF1}$ and the amplitude of the low side off-set threshold voltage $V_{REF2}$.

In the binarizing circuit 16, unless the output voltage $V_{OUT}$ is switched from low to high, the counter value of the counter circuit 40 is not subtracted. Further, unless the output voltage $V_{OUT}$ is switched from high to low, the counter value of the counter circuit 42 is not subtracted. Accordingly, after the output voltage $V_{OUT}$ stops inverting, the peak voltage $V_{PEAK}$ and the bottom voltage $V_{BOTTOM}$ are not changed. The width between the high side off-set threshold voltage $V_{REF1}$ and the low side off-set threshold voltage $V_{REF2}$ is not changed with time. Accordingly, even when the noise voltage is input into the binarizing circuit 16, the output voltage $V_{OUT}$ is prevented from inverting.

The operation of the binarizing circuit 16 is explained as follows.

Figure 13A:
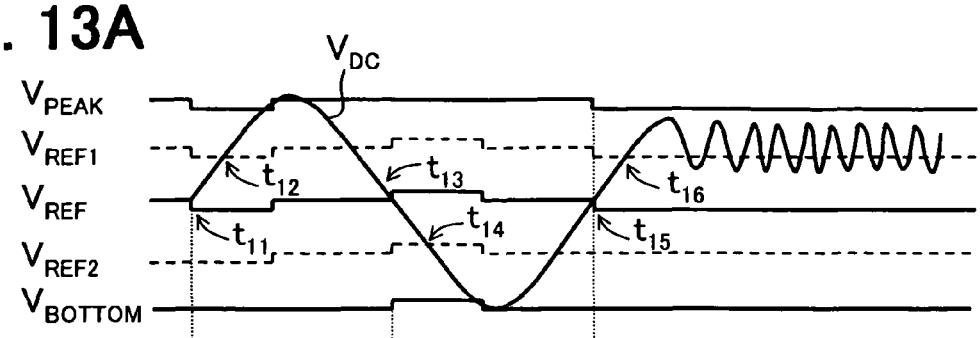
FIGS. 13A and 13B are graphs showing waveforms in the binarizing circuit according to the fourth embodiment.
Figure 13B:
Figure 14:
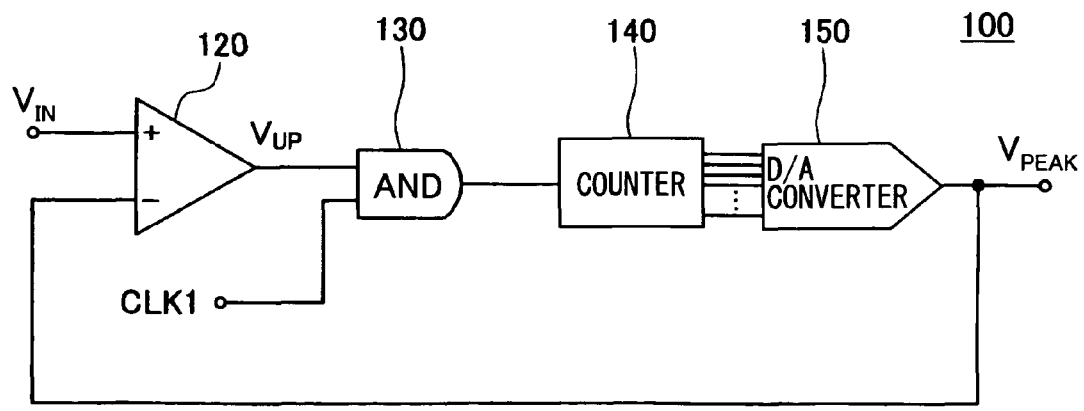
FIG. 14 is a schematic diagram showing a conventional peak voltage detector circuit.
Figure 15:
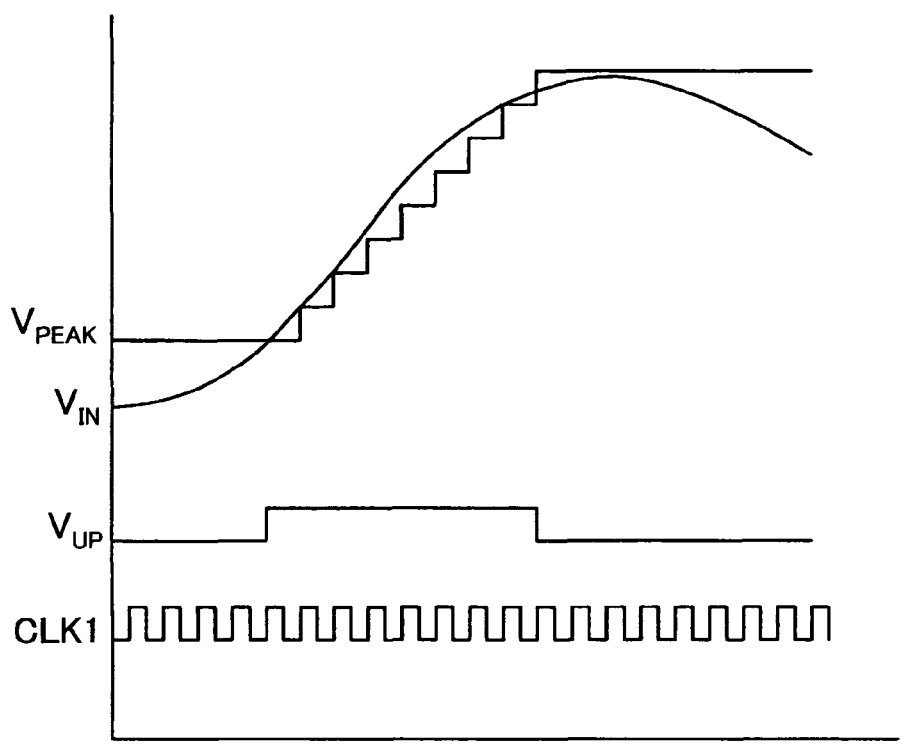
FIG. 15 is a waveform chart of the conventional peak voltage detector circuit.
Figure 16:
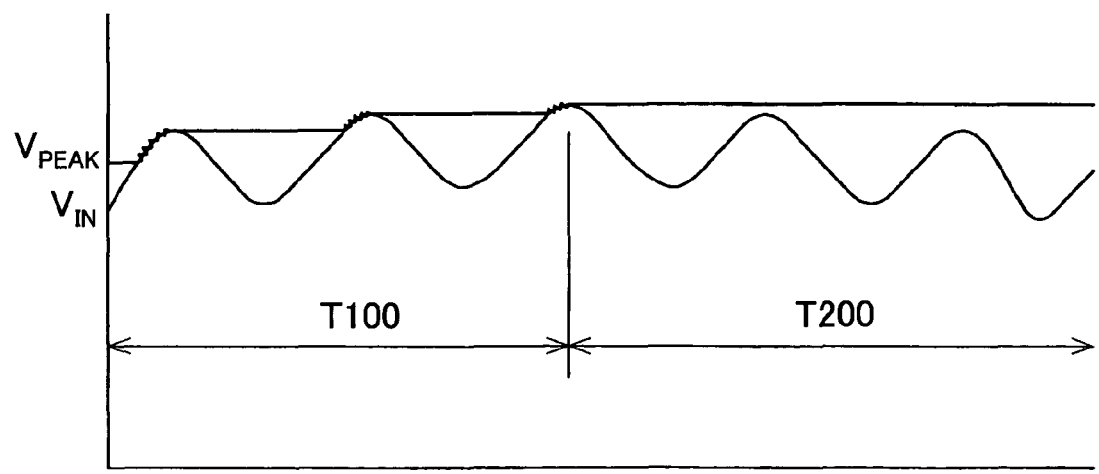
FIG. 16 is a waveform chart showing plural wave periods of an input voltage to be detected by the conventional peak voltage detector circuit.

The input voltage $V_{DC}$ shown in FIGS. 13A and 13B is normally generated by rotation of the rotor during a time period from the time t11 to the time t15. After the time t15, the noise voltage may be abnormally generated by vibration of the rotor.

Figure 11D:
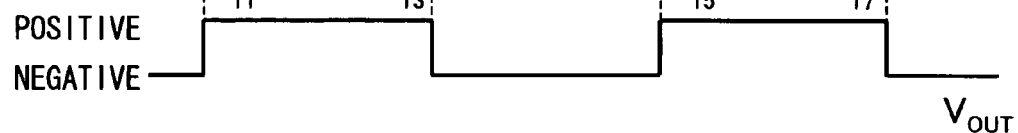

When the input voltage $V_{DC}$ exceeds the reference threshold voltage $V_{REF}$ at the time t11, t15, the output signal $V_{OUT}$ is inverted from negative to positive, as shown in FIG. 11D. In this case, the threshold voltage of the second comparator circuit 86 is switched to the low side off-set threshold voltage $V_{REF2}$, as shown in FIG. 11A. Since the output voltage $V_{OUT}$ is switched from low to high, the counter value of the counter circuit 40 is subtracted, so that the peak voltage $V_{PEAK}$ is reduced. When the input voltage $V_{DC}$ exceeds the high side off-set threshold voltage $V_{REF1}$ at the time t12, t16, the threshold voltage of the first comparator circuit 70 is switched to the reference threshold voltage $V_{REF}$, as shown in FIG. 11A. When the input voltage $V_{DC}$ falls below the reference threshold voltage $V_{REF}$ at the time t13, the output voltage $V_{OUT}$ is inverted from positive to negative, as shown in FIG. 11D. In this case, the threshold voltage of the first comparator circuit 70 is switched to the high side off-set threshold voltage $V_{REF1}$, as shown in FIG. 11A. Since the output voltage $V_{OUT}$ is inverted from high to low, the counter value of the counter circuit 42 is subtracted, so that the bottom voltage $V_{BOTTOM}$ increases. The input voltage $V_{DC}$ falls below the low side off-set threshold voltage $V_{REF2}$ at the time t14, the threshold voltage of the second comparator circuit 86 is switched to the reference threshold voltage $V_{REF}$, as shown in FIG. 11A.

In the binarizing circuit 16, in the time period from the time t11 to the time t15, the output voltage $V_{OUT}$ is inverted from low to high when the input voltage $V_{DC}$ exceeds the reference threshold voltage $V_{REF}$, and the output voltage $V_{OUT}$ is inverted from high to low when the input voltage $V_{DC}$ falls below the reference threshold voltage $V_{REF}$.

After the time t15, even if the noise voltage is generated, the output voltage $V_{OUT}$ is not inverted. As described above, in the binarizing circuit 16, the threshold voltage of the second comparator circuit 86 is switched to the low side off-set threshold voltage $V_{REF2}$ at the time t15. Unless the input voltage $V_{DC}$ falls below the low side off-set threshold voltage $V_{REF2}$, the threshold voltage of the second comparator circuit 86 is not switched to the reference threshold voltage $V_{REF}$. After the time t15, when the noise voltage exceeds the high side off-set threshold voltage $V_{REF1}$, the noise voltage does not fall below the low side off-set threshold voltage $V_{REF2}$. As described above, the amplitude of the noise voltage is smaller than one-sixth of the input voltage $V_{DC}$ generated by operation of the measurement object. Thus, both situations are not occurred continuously, one situation that the noise voltage falls below the low side off-set threshold voltage $V_{REF2}$, and the other situation that the noise voltage exceeds the high side off-set threshold voltage $V_{REF1}$. After that, the second comparator circuit 86 does not invert, so that the input voltage $V_{DC}$ is not inverted. Thus, the peak voltage $V_{PEAK}$ and the bottom voltage $V_{BOTTOM}$ are not changed slowly. After the time t15, when the noise voltage falls below the low side off-set threshold voltage $V_{REF2}$, the noise voltage does not exceeds the high side off-set threshold voltage $V_{REF1}$, since the amplitude of the noise voltage is smaller than the input voltage $V_{DC}$. After that, the first comparator circuit 70 does not invert, so that the input voltage $V_{DC}$ is not inverted. Thus, the peak voltage $V_{PEAK}$ and the bottom voltage $V_{BOTTOM}$ are not changed slowly.

The timing when the output voltage $V_{OUT}$ of the binarizing circuit 16 is inverted is used as the second clock signal CLK2, so that the output voltage $V_{OUT}$ is prevented from inverting even when the noise voltage is generated. Thus, the binarizing circuit 16 does not count the change of the noise voltage.

Such changes and modifications are to be understood as being within the scope of the present invention as defined by the appended claims. While the invention has been described with reference to a preferred embodiment thereof, it is to be understood that the invention is not limited to the preferred embodiment and constructions. The invention is intended to cover various modification and equivalent arrangements. The invention is intended to cover various combinations and configurations, which are preferred, other combinations and configurations, including more, less or only a single element, are also within the spirit and scope of the invention.

What is claimed is:

1. A peak voltage detector circuit for detecting a peak voltage of an input voltage comprising:

a comparator having a first input terminal and a second input terminal, wherein the input voltage is input into the first input terminal of the comparator;
a first clock signal generating circuit for generating a first clock signal;
a second clock signal generating circuit for generating a second clock signal;
a counter circuit for counting up a counter value in synchronization with the first clock signal, when an output signal output from the comparator is in a first state, wherein the counter circuit counts down the counter value in synchronization with the second clock signal; and
a digital-analog conversion circuit for outputting an output voltage corresponding to the counter value of the counter circuit, wherein the output voltage of the digital-analog conversion circuit is input into the second input terminal of the comparator, wherein
the first clock signal has a wave period shorter than that of the second clock signal.

2. The peak voltage detector circuit according to claim 1, wherein
the counter circuit counts up the counter value in synchronization with the first clock signal, when the output signal output from the comparator is in the first state, and
the counter circuit counts down the counter value in synchronization with the second clock signal, when the output signal output from the comparator is in a second state opposite to the first state.

3. The peak voltage detector circuit according to claim 1, wherein the input voltage has an alternating waveform.

4. A peak voltage detector circuit for detecting a positive peak voltage of an input voltage comprising:
a comparator having a noninversion input terminal and an inversion input terminal, wherein the input voltage is input into the noninversion input terminal of the comparator;
a first clock signal generating circuit for generating a first clock signal;
a second clock signal generating circuit for generating a second clock signal;
a counter circuit for adding a counter value in synchronization with the first clock signal, when an output signal output from the comparator is high, wherein the counter circuit subtracts the counter value in synchronization with the second clock signal; and
a digital-analog conversion circuit for outputting an output voltage corresponding to the counter value of the counter circuit, wherein the output voltage of the digital-analog conversion circuit is input into the inversion input terminal of the comparator, wherein
the first clock signal has a wave period shorter than that of the second clock signal.

5. The peak voltage detector circuit according to claim 4, wherein
the counter circuit subtracts the counter value in synchronization with the second clock signal, when the output signal output from the comparator is low.

6. The peak voltage detector circuit according to claim 4, wherein the input voltage has an alternating waveform.

7. A binarizing circuit for converting an input voltage having an alternating waveform into a digital signal, the binarizing circuit comprising:
a first peak voltage detector circuit for detecting a positive peak voltage of an input voltage;
a second peak voltage detector circuit for detecting a negative peak voltage of an input voltage; and
a determination circuit for providing a threshold voltage based on the positive peak voltage provided by the first peak voltage detector circuit and the negative peak voltage provided by the second peak voltage detector circuit, wherein
the first peak voltage detector circuit includes:
a first comparator having a noninversion input terminal and an inversion input terminal, wherein the input voltage is input into the noninversion input terminal of the first comparator;
a first clock signal generating circuit for generating a first clock signal;
a second clock signal generating circuit for generating a second clock signal;
a first counter circuit for adding a counter value in synchronization with the first clock signal, when an output signal output from the first comparator is high, wherein the first counter circuit subtracts the counter value in synchronization with the second clock signal; and
a first digital-analog conversion circuit for outputting an output voltage corresponding to the counter value of the first counter circuit, wherein the output voltage of the first digital-analog conversion circuit is input into the inversion input terminal of the first comparator, and wherein the first clock signal has a wave period shorter than that of the second clock signal,
the second peak voltage detector circuit includes:
a second comparator having a noninversion input terminal and an inversion input terminal, wherein the input voltage is input into the inversion input terminal of the second comparator;
a third clock signal generating circuit for generating a third clock signal;
a fourth clock signal generating circuit for generating a fourth clock signal;
a second counter circuit for subtracting a counter value in synchronization with the third clock signal, when an output signal output from the second comparator is high, wherein the second counter circuit adds the counter value in synchronization with the fourth clock signal; and
a second digital-analog conversion circuit for outputting an output voltage corresponding to the counter value of the second counter circuit, wherein the output voltage of the second digital-analog conversion circuit is input into the noninversion input terminal of the second comparator, and wherein the third clock signal has a wave period shorter than that of the fourth clock signal, and
the determination circuit determines the input voltage to be high or low based on the provided threshold voltage.

8. The binarizing circuit according to claim 7, wherein
the determination circuit includes first and second comparator circuits and a selecting circuit,
the threshold voltage includes a reference threshold, a high side off-set threshold and a low side off-set threshold,
the reference threshold is defined by a center value between the positive peak voltage and the negative peak voltage,
the high side off-set threshold is defined by a center value between the reference threshold and the positive peak voltage,
the low side off-set threshold is defined by a center value between the reference threshold and the negative peak voltage, the first comparator circuit inverts a first output thereof, and switches the reference threshold to the high side off-set threshold when the input voltage falls below the reference threshold, the first comparator circuit inverts the first output, and switches the high side off-set threshold to the reference threshold when the input voltage exceeds the high side off-set threshold, the second comparator circuit inverts a second output thereof, and switches the reference threshold to the low side off-set threshold when the input voltage exceeds the reference threshold, the second comparator circuit inverts the second output, and switches the low side off-set threshold to the reference threshold when the input voltage falls below the low side off-set threshold, the first and second outputs from the first and second comparator circuits are input into the selecting circuit, the selecting circuit inverts a third output thereof when the first output is inverted at a time when the input voltage falls below the reference threshold, and the selecting circuit inverts the third output when the second output is inverted at a time when the input voltage exceeds the reference threshold.

9. The binarizing circuit according to claim 8, wherein the third output has a timing at which the third output is inverted, and the timing of the third output provides the second clock signal.

10. The binarizing circuit according to claim 7, wherein the first counter circuit subtracts the counter value in synchronization with the second clock signal when the output signal output from the first comparator is low, and wherein the second counter circuit adds the counter value in synchronization with the fourth clock signal when the output signal output from the second comparator is low.

* * * * *